United States Patent [19]
Proebsting

[11] Patent Number: 6,137,157
[45] Date of Patent: Oct. 24, 2000

[54] SEMICONDUCTOR MEMORY ARRAY HAVING SHARED COLUMN REDUNDANCY PROGRAMMING

[75] Inventor: Robert J. Proebsting, Los Altos Hills, Calif.

[73] Assignee: Townsend and Townsend and Crew LLP, San Francisco, Calif.

[21] Appl. No.: 09/083,327

[22] Filed: May 21, 1998

Related U.S. Application Data

[60] Provisional application No. 60/047,361, Jun. 2, 1997.

[51] Int. Cl.[7] .......................... H01L 23/58; H01L 23/62; G11C 29/00
[52] U.S. Cl. ............................ 257/665; 714/711
[58] Field of Search ................. 365/200, 225.7; 714/711; 257/665

[56] References Cited

U.S. PATENT DOCUMENTS

| | | | |
|---|---|---|---|
| 5,610,865 | 3/1997 | Shin et al. | 365/200 |
| 5,732,029 | 3/1998 | Lee et al. | 365/200 |
| 5,999,463 | 12/1999 | Park et al. | 365/200 |

*Primary Examiner*—Brian Dutton
*Attorney, Agent, or Firm*—Townsend and Townsend and Crew LLP; Henry K. Woodward

[57] ABSTRACT

Surface area of a semiconductor integrated circuit memory required by programmable fuse boxes is reduced, and the capacitive loading of a column address bus from the programmable fuse boxes is reduced by reducing the number of programmable boxes. Each programmable fuse box is connected through fuses to a plurality of redundant columns in memory arrays whereby any one or more of the redundant column lines can be addressed through the programmed fuse box in replacing a defective column line. An unprogrammed redundant column select line is connected to ground through the fuses connecting the unselected redundant column select lines to ground so that unprogrammed redundant columns are inactive.

6 Claims, 2 Drawing Sheets

SEMICONDUCTOR MEMORY ARRAY HAVING SHARED COLUMN REDUNDANCY PROGRAMMING

This is a continuation of Provisional Application, Ser. No. 60/047,361 filed on Jun. 2, 1997.

BACKGROUND OF THE INVENTION

This invention relates generally to semiconductor integrated circuit memory arrays, including static (SRAM), dynamic (DRAM), and programmable (Flash or $E^2$). More particularly the invention relates to memory arrays having a plurality of redundant columns and to the sharing of redundant column programming fuse boxes for replacing defective memory columns.

Present semiconductor integrated circuit memories can store many megabits of data. Typically, each memory comprises a plurality of memory arrays with each array reading or writing perhaps a byte of data (e.g., 8-bits) with a plurality of arrays (e.g., 4) being accessed concurrently to provide a data word (e.g. 32-bits).

Each array has a plurality of addressable columns with an additional number of redundant columns for use in replacing defective columns. Heretofore, each redundant column or fixed group of columns has been programmed with its own dedicated programmable fuse box so that each redundant column (or group of columns) can replace a defective column (or group of columns) by programming that particular fuse box. While the provision of individual fuse boxes for individual redundant columns provides maximum flexibility in using the redundant columns, each fuse box requires as much or more surface area as does the redundant column. Also, each fuse box adds capacitive loading to the address bus which slows the speed of operation. Further, when a fuse box is dedicated to always program a group of redundant columns to replace a group of normal columns, as contrasted to a single column, several redundant columns are effectively wasted when a single normal column is defective. The present invention is directed to reducing surface space required by fuse boxes and reducing the capacitive loading of the column address bus by the fuse boxes.

SUMMARY OF THE INVENTION

Briefly, in accordance with the invention, a fuse box for connecting redundant columns into a memory is shared by a plurality of redundant columns, thereby reducing the number of fuse boxes and the capacitive loading on the address bus thereof. The redundant columns can be programmed individually in replacing an isolated defective column in a memory array, or a plurality of redundant columns can be programmed by a single fuse box to replace a plurality of adjacent defective columns having the same column address.

In a preferred embodiment, each redundant column in an array can be programmed by a plurality of fuse boxes and each fuse box can simultaneously select one of more redundant columns, thereby providing added flexibility in using the redundant columns.

The invention and objects and features thereof will be more readily apparent from the following detailed description and appended, claims when taken with the drawings.

DETAILED DESCRIPTION OF THE ILLUSTRATIVE EMBODIMENTS

Figure 1:
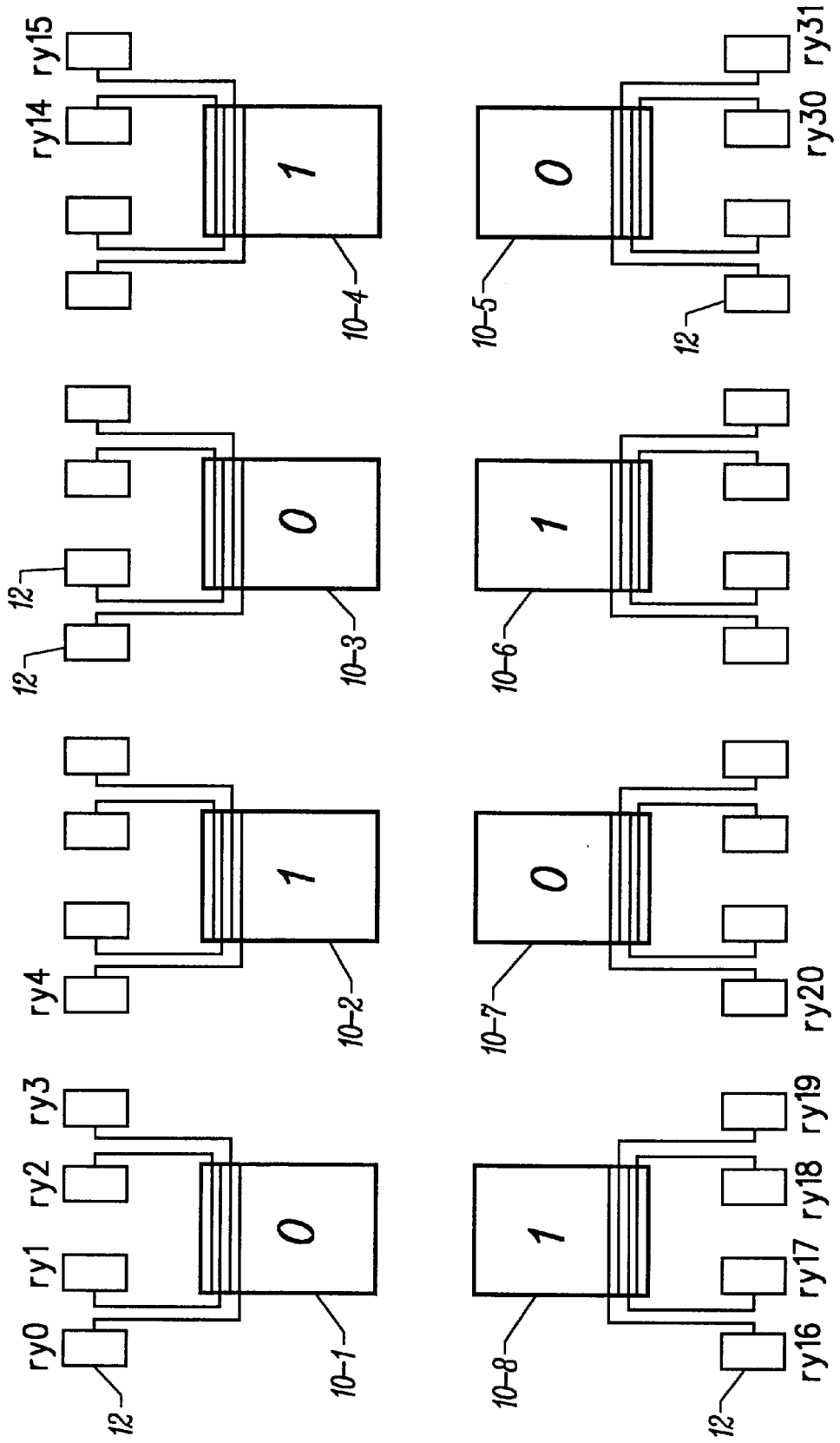
FIG. 1 is a functional block diagram of a semiconductor integrated circuit memory array having redundant columns in accordance with the prior art.

FIG. 1 is a functional block diagram of a plurality of memory arrays 10-1 through 10-8 of a semiconductor integrated circuit memory. In this embodiment, each array provides many columns of memory, a subset of which is selected by a common address. Each subset, when selected, provides for example 8 bits of data. Eight arrays are accessed in groups of four, each selected array providing 8 bits so that a total of 32-bits, can be accessed. As is standard with semiconductor memories, the selection of a column address accesses the bit lines connected thereto, whereby the data from the selected memory cell is transferred through the bit lines and directed through sense amplifiers and I/O lines to a data bus (not shown).

Each of the arrays 10-1 through 10-8 is provided with four redundant column lines or 32 redundant column lines in total, designated RY0 through RY31. Each of the redundant column lines can be used to replace any defective column line among the normal column lines of its array by the programming of fuse blocks 12 through which each redundant column line can be programmed to respond to a desired address on the column address bus. By having an individual fuse box for each redundant column, maximum flexibility in using the redundant columns is realized. However, as noted above each fuse box requires as much or more surface area as each redundant column, thereby substantial chip surface area is required for the individual fuse boxes. Further, each fuse box, whether programmed or not, adds capacitive loading to the address bus which slows operation in addressing the array columns.

Figure 2:
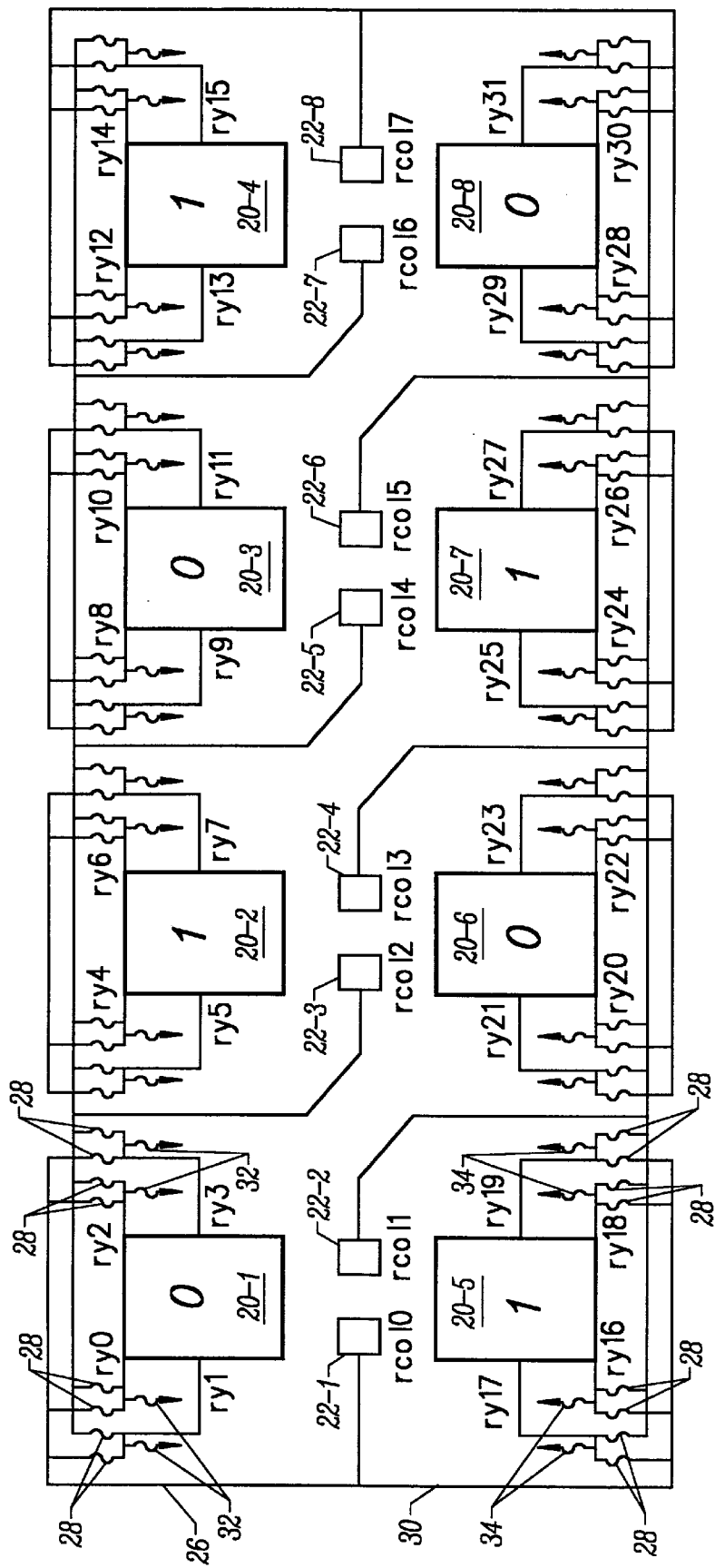
FIG. 2 is a functional block diagram of a semiconductor integrated circuit memory array having redundant columns in accordance with one embodiment of the invention.

The present invention is directed to reducing the surface area required for fuse boxes and reducing the capacitive loading of the fuse boxes on the column address bus. FIG. 2 is a functional block diagram of one embodiment of a plurality of arrays 20-1 through 20-8 of a semiconductor integrated circuit memory; again, with each of 8 arrays having four redundant column select lines RY0 through RY31. However, in accordance with the invention, a fewer number of fuse boxes 22-1 through 22-8 share the decoding of the redundant column lines with each fuse box progammably accessing a group of redundant column lines. For example, fuse box 22-1 is connected through line 26 and fuses 28 to redundant lines RY0 through RY3 of array 20-1 and also through line 30 and fuses 28 to redundant column lines RY16 through RY19 of array 20-5. Further, before any programming column select lines RY0 through RY31 are connected to ground through fuses 32. Unless a fuse box such as fuse box 22-1 is programmed, the fuse box output is connected to circuit ground through the line 26, fuses 28, and fuses 32, deselecting the redundant columns. The ground bias on the fuse box does not effect the addressing of the column address bus. When a redundant column line is to replace one or more defective columns of any array, the fuse box is programmed to the address of the defective column, left connected to the redundant column or columns to be substituted for the defective column or columns but is disconnected from all other redundant columns. The disconnect to all other redundant column select lines is accomplished by blowing fuses connecting the fuse box to redundant column lines not selected. For example, if fuse box 22-1 is programmed to replace a single defective column line in array 20-1 with redundant column line RY1, of all the fuses 28 connected to fuse box 22-1, only the fuse 28 connecting the input to RY1 remains unblown, and all 7 other fuses 28 connecting fuse box 22-1 to the redundant column lines RYO, RY2, RY3 and RY16 through RY19 are blown. Also fuse 32 connecting RY1 to ground is blown, as is fuse 28 connecting RY1 to fuse box 22-3. Accordingly, only redundant column line RY1 will then be connected to the programmed fuse box 22-1 as a substitute for the defective column line at the address to which fuse box 22-1 is programmed.

Similarly, the other fuse boxes such as fuse box 22-2 are connected to groups of redundant column lines. For example, fuse box 22-2 is connected through fuses 28 to the redundant column lines RY16 through RY19 of array 20-5 and through fuses 28 to the redundant column lines RY20 through RY23 of array 20-6. Thus, the redundant column lines of any one array are connected through fuses to two different fuse boxes 22. For example, the redundant column lines RY20 through RY23 of array 20-6 are connectable to fuse box 22-2 or to fuse box 22-4, redundant column lines RY24 through RY27 of array 20-7 are connected to fuse boxes 22-4 and 22-6; and redundant column lines RY28 through RY31 of array 20-8 are connected to fuse box 22-6 and fuse box 22-8.

Thus, in this embodiment, each redundant column line can be programmed through one of two fuse boxes in replacing a defective column line of the memory. Once a redundant column line and fuse box are selected for replacing a defective line, all fuses connecting the fuse box to other redundant column lines must be blown, as well as all fuses connecting the selected redundant column to other fuse boxes or to ground. Thus only the chosen redundant column line is connected through the programmed fuse box. By sharing each fuse box with a plurality of redundant column lines, the number of fuse boxes is reduced, thereby reducing the fuse box surface area of the memory chip, and the capacitive loading of the fuse boxes on the column address bus.

Often, a defect is large enough to affect more than one column. Several adjacent columns may be defective. In the preferred embodiment, these adjacent columns would serve different input/outputs, but would share the same column address. A significant benefit of this redundancy architecture is that a plurality of redundant column lines having the same column address in the memory, can be connected through a single fuse box in replacing a cluster of defective column lines by selecting which fuses 28 are not blown. Or, as previously described, a single redundant column line can replace a single defective column line in the memory. Fewer fuse boxes may be needed than the number of defective columns. But the relatively low number of fuse boxes—8 in the preferred embodiment—means that not all redundant lines are available for use in replacing defective column lines of a memory. In this example, if more than 3 different column addresses are defective in any single memory array or if more than 8 different column addresses are defective in the combined 8 memory arrays, the part would be unrepairable. This reduces the flexibility in using the redundant lines, but this is more than offset by the reduced capacitive loading and reduced surface area attributed to the programmable fuse boxes.

While the invention has been described with reference to one specific embodiment, the description is illustrative of the invention and is not to be construed as limiting the invention. Various modifications and applications may occur to those skilled in the art without departing from the true spirit and scope of the invention as defined by the appended claims.

What is claimed is:

1. A semiconductor integrated circuit memory comprising:

a plurality of addressable columns of memory cells for the reading and storing of data bits and a plurality of redundant columns of memory cells for use in replacing defective columns, a column address bus connected with said addressable columns for addressing the addressable columns in the reading and storing of data therein, and at least two fuse boxes which are programmably connectable to the column address bus and programmably connectable to subsets of the redundant columns and in which each redundant column is programmably connectable to more than one shared fuse box, whereby a redundant column can be connected to the column address bus through a fuse box to replace a defective column.

2. The semiconductor integrated circuit memory as defined by claim 1 wherein a fuse box is connected through a first fuse to each programmably connected redundant column.

3. The semiconductor integrated circuit memory as defined by claim 1 wherein a fuse box is connected through a first fuse to each programmably connected redundant column.

4. The semiconductor integrated circuit memory as defined by claim 3 wherein each first fuse connected to each programmably connected redundant column is connected through a second fuse to ground, whereby a ground signal is unconditionally applied to an unprogrammed redundant column through said second fuse.

5. The semiconductor integrated circuit memory as defined by claim 4 wherein in programming a selected redundant column through a fuse box all first fuses are blown except for the first fuse connected to the selected redundant column or columns.

6. The semiconductor integrated circuit memory as defined by claim 5 wherein the second fuse connected to the first fuse connected to the selected redundant column is blown, thereby removing ground from the programmed redundant column.

* * * * *